United States Patent [19]

Milkovic

[11] 4,286,214

[45] Aug. 25, 1981

[54] CURRENT SENSOR FOR PHASE INVERSION-MODULATION OF AC SIGNALS

[75] Inventor: Miran Milkovic, Scotia, N.Y.

[73] Assignee: General Electric Company, Somersworth, N.H.

[21] Appl. No.: 36,770

[22] Filed: May 7, 1979

[51] Int. Cl.³ .................................. G01R 21/06
[52] U.S. Cl. ..................... 324/142; 324/123 R; 324/127
[58] Field of Search ................. 324/142, 123 R, 127

[56] References Cited

U.S. PATENT DOCUMENTS

| | | | |
|---|---|---|---|
| 3,025,414 | 3/1962 | McVey | 324/123 R X |
| 3,673,495 | 6/1972 | Riebs | 324/142 |
| 3,725,774 | 4/1973 | Stewart, Jr. | 324/142 |
| 3,815,011 | 6/1974 | Milkovic | 324/123 R X |
| 3,815,013 | 6/1974 | Milkovic | 324/123 R X |
| 3,875,508 | 4/1975 | Milkovic | 324/142 |
| 3,875,509 | 4/1975 | Milkovic | 324/142 |
| 3,955,138 | 5/1976 | Milkovic | 324/142 X |
| 4,074,194 | 2/1978 | Wilkerson | 324/142 |
| 4,118,787 | 10/1978 | Arnoux | 324/142 X |
| 4,198,595 | 4/1980 | Milkovic | 324/127 X |

Primary Examiner—Stanley T. Krawczewicz
Attorney, Agent, or Firm—Robert E. Brunson

[57] ABSTRACT

A circuit for sensing the magnitude of an AC signal applied to the circuit includes control means for reversing the polarity of the AC signal to thereby generate an output signal which is proportional in amplitude to the magnitude of the AC signal and which has a phase, with respect to the phase of the AC signal, determined by the control means. The control means also provides the capability of generating output pulses from the circuit which have an amplitude proportional to the magnitude of the AC signal and a pulse-width-spacing proportional to the duty cycle of a pulsating control signal applied to the control means.

14 Claims, 4 Drawing Figures

CURRENT SENSOR FOR PHASE INVERSION-MODULATION OF AC SIGNALS

BACKGROUND OF THE INVENTION

1. Field of the Invention

The present invention is related generally to electronic current sensor type circuits and more particularly to such type circuits for use in electronic metering devices wherein phase inversion or amplitude-mark-space modulation (time division) techniques are employed to make precision measurements of alternating current and/or voltage.

2. Description of the Prior Art

While the present invention has application in most any environment where the magnitude of a large AC signal has to be sensed and/or measured, it finds particular application in such devices as watthour meters, watt-transducers and the like.

In recent years, electronic watt-hour or energy consumption meters have come into existence, with the expectation that they will one day replace the older prior art induction type meters. This electronic metering technology is still in the refinement stages of development. Three such type electronic energy consumption meters are disclosed in my U.S. Pat. Nos. 3,955,138; 3,875,509, and 3,875,508. The entire disclosure of these earlier patents is hereby incorporated by reference. The entire right, title and interest in and to the inventions described in the aforementioned patents and the entire right, title and interest in and to the invention herein disclosed, as well as in and to the patent application of which this application is a part, are assigned to the same assignee.

One major problem in electronic watt-meter design is to sense or measure the magnitude of the current of an AC signal with high precision, while simultaneously inverting that signal in a circuit which utilizes a minimum amount of power and which presents the lowest possible load or impedance to the circuit being monitored. While the above mentioned precision is possible with the use of large and expensive electrical and electronic components, the cost and size of those components quickly removes the economic incentive for a user to purchase a meter using such components. As such, a need exists for a universally usable AC sensor circuit design having phase inversion or mark-space-modulation capabilities which can be fabricated from small low cost components and which design provides for virtually powerless sensing of the magnitude of the current of an AC signal.

SUMMARY OF THE INVENTION

The present invention fulfills the above needs by the provision of a low cost electronic sensor circuit suitable for fabrication in monolithic integrated circuit form.

The sensor circuit of the present invention provides, in combination, a small low impedance current transformer terminated in an active load amplifier circuit through a polarity switch which can be used for modulation and/or phase inversion of a sensed AC signal.

Through the combined use of a low input impedance amplifier and a substantially zero resistance polarity switch for connecting the current transformer to the input of the amplifier, the current transformer continuously operates virtually short circuited regardless of the position of the switch. By virtue of this short circuit operation, the potential or voltage difference across the input terminals of the amplifier is always negligible. Because of this low voltage difference, it is possible to use low voltage inexpensive transformers, analog switches and components in the present invention. Further, the low potential difference substantially reduces or eliminates switching voltage transients which normally occur at the switched inputs of amplifiers of the type contemplated for use in the present invention.

The foregoing advantages afforded by the present invention provide a circuit capable of virtually powerless precision monitoring of large AC currents to obtain a phase controllable output voltage from the amplifier which is directly proportional to the magnitude of the monitored current.

In view of the preceding, it is therefore an object of the present invention to provide an alternating current sensor circuit having enhanced operating characteristics.

It is another object of the present invention to provide a sensor circuit capable of virtually powerless precision monitoring of alternating current.

A still further object of the invention is to provide a sensor circuit suitable for applications requiring the precision sensing and/or measurement of alternating current signals which does not load the circuit being monitored.

Yet another object of the present invention is to provide a switch operated phase inversion-modulation sensor circuit capable of accurately generating an output voltage proportional to sensed current whereby the output voltage is proportional to monitored current and has a phase and/or modulation characteristic determined by the switch position and/or the duty cycle of a control signal applied to the switch.

It is still a further object of the present invention to provide a sensor circuit for monitoring alternating signals of large current magnitude capable of being fabricated from low cost, small size current and voltage components.

BRIEF DESCRIPTION OF THE DRAWING

The preceding objects, including other objects and advantages of the invention, will be more clearly appreciated by reading the following detailed description taken in conjunction with the accompanying drawing, in which.

DESCRIPTION OF THE PREFERRED EMBODIMENTS

Figure 1:
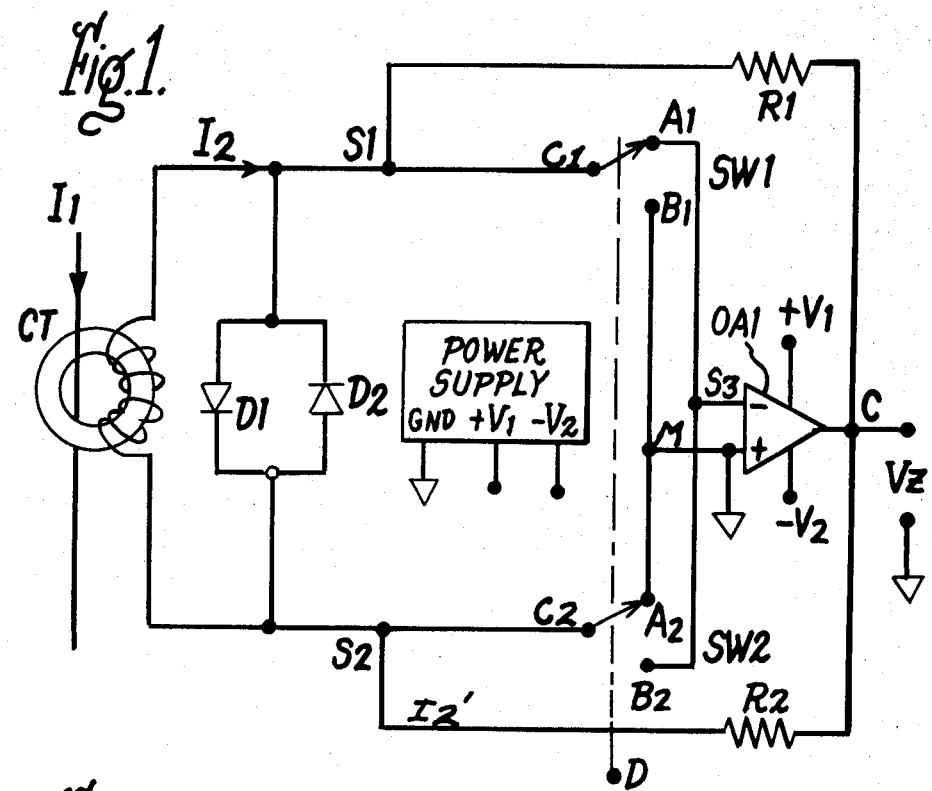
FIG. 1 is a schematic diagram of an electronic sensor circuit in accordance with the basic teachings of the invention.

A first illustrated embodiment of the invention is shown in the schematic diagram of FIG. 1, wherein a current transformer CT is connected to an alternating current power source (not shown) for monitoring or sensing an AC-current $I_1$. As shown, the primary winding of the transformer is a single wire carrying the AC-current $I_1$. The secondary winding of the transformer consists of many windings or turns for transforming the primary current $I_1$ to a desired secondary current shown as $I_2$.

The secondary winding of the transformer CT is connected to inverting (−) and non-inverting (+) input terminals of a transresistance amplifier OA1 via a double pole double throw switch illustrated as SW1 and SW2. There are any number of different types of amplifiers suitable for use with the present invention. One such amplifier is a type uA741 high performance integrated circuit operational amplifier manufactured by Fairchild Semiconductor, a division of Fairfield Camera and Instrument Corporation, 313 Fairchild Drive, Mountain View, California.

A conventional power supply is provided having a circuit ground or reference potential for providing two bias voltages +V1 and −V2 to amplifier OA1.

Still referring to FIG. 1, the aforementioned switch (SW1 and SW2) serves as an analog switch for switching the polarity of the input current $I_2$ applied to the first (−) and second (+) input terminals of OA1. While that switch may be a mechanical switch as diagrammatically shown, those in the art will recognize that in actual practice SW1 and SW2 may be realized as a plurality of active electronic switch elements controlled by an electronic control signal applied to a control terminal D. Preferably, the switch (SW1 and SW2) is realized as a low cost low voltage C-MOS device such as conventionally available in the art, or as C-MOS elements which are integrally formed in a single monolithic integrated circuit together with the other circuitry of FIG. 1.

As shown in FIG. 1, SW1 is comprised of switch contacts or terminals A1, B1 and C1 and SW2 has similarly associated terminals A2, B2, and C2. Terminals A1 and B2 of SW1 and SW2 respectively are secured together as output terminals and connected to the inverting (−) input terminal of OA1 at a summation point S3. In a similar fashion, output terminals B1 and A2 of SW1 and SW2 respectively are connected to the non-inverting (+) input terminal of OA1. As shown, the + input terminal of OA1 also serves as a ground return for current to flow from the amplifier OA1 through the CT secondary winding during circuit operation.

As previously mentioned, the polarity of the secondary current $I_2$ is switch controlled for application to the input terminals of OA1. As seen by observation of FIG. 1, this control is provided by the connections of SW1 and SW2, where the secondary winding of the CT is connected to the input terminals C1 and C2 of the analog switch. With the switch contacts C1, A1 and C2, A2 in the positions shown, an output voltage Vz is generated at an output terminal C of OA1 which is in phase with the line current $I_1$ and which has an amplitude proportional to the magnitude of that current. When the switch contacts are changed to connect B1 and B2 to C1 and C2 respectively, the polarity of the current $I_2$ applied to the input terminals of OA1 is changed. This results in a change in the phase of the output voltage Vz with respect to the line current $I_1$. With the switch contacts in this latter position, the amplitude of Vz is still proportional to the magnitude of $I_1$.

Two feedback resistors R1 and R2 are also connected from the output terminal C of OA1 to the input terminals of OA1 (via SW1 and SW2) for controlling the gain of the amplifier. As shown in FIG. 1, the resistors R1 and R2 are terminated at corresponding summation points S1 and S2 respectively. With the switch contacts C1, A1 and C2, A2 in the positions shown, the gain of OA1 is controlled by feedback resistor R1, which is connected to the − input terminal of OA1 via the contacts C1, A1 of SW1. When the switch is changed to close contacts C1, B1 and C2, B2 of SW1 and SW2 respectively, R2 serves to control the gain of OA1 by being connected to the − input terminal of OA1 via SW2.

The operating principles of the invention will be disclosed with reference to FIG. 1. However, as an aid to an understanding of some of those principles, reference is made to my prior U.S. Pat. No. 3,815,013. That patent is entitled "Current Transformer With Active Load Termination" and it is assigned to the same assignee of the present invention. This patent provides a detailed analysis and an operational description of a current transformer, similar to transformer CT, operating directly into a low impedance or transresistance amplifier similar to OA1 of FIG. 1.

Some of the analytical details of the circuit described in my aforementioned U.S. Pat. No. 3,815,013 are applicable to an understanding of the present invention. However, those details will not be discussed herein, except as necessary to a complete understanding of the present invention. For that reason, that patent is incorporated herein as reference material for information purposes.

To understand the operation of the present invention, it is considered advantageous to make a few observations. First, as described in my U.S. Pat. No. 3,815,013, the transformer CT is considered as an ideal AC-current source having a very low (negligible) output or source impedance at the operating frequency of $I_1$ (eg. 60 Hz line voltage). Also, amplifier OA1 has a very low input impedance $Z_i$ which may be expressed by the following approximation:

$$Z_i = R_f / A_0 \qquad \text{(equation 1)}$$

Where $R_f$ represents a feedback impedance, such as the resistance of $R_1$ or $R_2$, connected between points C and $S_1$ or C and $S_2$ respectively, and Ao represents the open loop gain of amplifier OA1. This expression (equation 1) neglects any resistance in the contacts C1, A1 and C2, A2. The effects of this resistance will be described in the ensuing description.

Because of the low source impedance of transformer CT and the low input impedance of amplifier OA1 (see U.S. Pat. No. 3,815,013), the secondary winding of the transformer is virtually short circuited. This results in an ideal (short circuit) current transformer operating condition.

Also, as contemplated by the present invention, the line current $I_1$ is an alternating current sign wave which goes through positive and negative half cycles. Thus, by reference to FIG. 1, it can be seen that $I_2$ will flow first in one direction through the secondary winding of CT during one half cycle (eg. positive), and then in the opposite direction during the other half cycle (eg. negative) for a complete cycle of $I_1$ and $I_2$.

With the previous observations in mind, reference is now made to FIG. 1. During the positive half cycle of $I_2$ (and $I_1$), $I_2$ flows into the summing points $S_1$ in the direction of the arrow head as illustrated. From $S_1$, $I_2$ flows through resistor $R_1$ into the output terminal C of amplifier OA1. Amplifier OA1 is now functioning as a current sink for a load not shown. Under this condition I₂ flows through OA1, and out of the −V2 terminal back to the power supply, where the current path is completed to ground at point M to return back to the CT secondary winding via contacts C2, A2 of SW2.

On the next half cycle (negative) of I₂ (and I₁) the direction of current flow reverses through the secondary winding of the CT and now flows out of terminal C of OA1, through R1 into S1 to the CT secondary winding. Under this condition, OA1 is now operating as a current source for the load whereby current is being provided to OA1 via the +V1 terminal of the power supply, with the current return path to the power supply being through the secondary winding to point M (ground).

It should be noted that summing point S3 is at the same potential as summing point S1. As described in my U.S. Pat. No. 3,815,013, because R1 is connected between the inverting (−) input (via SW1) and the output C of OA1, the potential of S3 (and S1) is virtually at zero volt, with a typical value being 0.5 millivolt or less. Further, the impedance between S1 (and S3) and M (ground) is very low. Typically, this impedance is 0.2 ohm or less. Thus, the potential between M (ground) and S1 (and S3) is substantially the same (ie. zero). As a result, the summing point S3 (or S1) conducts no current to point M (ground). In other words, the input current to the inverting (−) input terminal at S3 of OA1 is so insignificant that it can be neglected.

The output voltage $V_z$, as measured between points C and M (ground), is proportional to $I_1$ or $I_2$ and can be calculated from the following expression:

$$V_z = -I_2 \cdot R_1 \qquad \text{(equation 2)}$$

Utilizing typical values in the above equation 2 as an example, if $I_2 = 2$ ma and $R_1 = 10K$ ohms, then $V_z = -10$ volts. The negative sign appears in equation 2 and this example because $V_z$ is inverted 180° in phase with respect to $I_1$ or $I_2$. Other values for $R_1$ can also be used, depending upon the magnitude of $I_1$ (or $I_2$) and the amplitude desired for $V_z$.

Still referring to FIG. 1, let it now be assumed that the switch (SW1 and SW2) contacts are changed to close contacts C1, B1 and C2, B2 whereby, contacts A1 and A2 are open. The transformer secondary is now grounded at S1 via C1, B1 of SW1 to point M (the + input of OA1) and the other end of the secondary is applied to S3, the (−) input of OA1 via summation point S2 and C2, B2 of SW2. As can be seen, the polarity of the current I₂ applied to OA1 is now reversed 180°. This in turn causes a 180° phase reversal of the output voltage $V_z$. It should also be noted, that resistor R1 is removed from the circuit and replaced by resistor R2 to now provide the aforementioned feedback path around OA1 as previously described.

With the SW1 and SW2 contacts in the last described position, the invention operates in the same manner as when those contacts are in the C1, A1 and C2, A2 closed positions. Further, the preceding expression for the calculation of input impedance (Zi) and the output voltage ($V_z$) also apply, if R2 is substituted for R1.

Still referring to FIG. 1, it will be noted that, as SW1 and SW2 are switched between positions A1, B1 and A2, B2 respectively, the resistors R1 and R2 are alternately grounded at one end at S1 and S2 via the respective switch contacts. If it is assumed that there is no resistance between any of the contacts of SW1 and SW2, which would be the case if a mechanical switch is employed, then points S1 and S2 will alternately be at ground (zero potential). Thus, as previously described, the secondary winding of the CT is always short circuited by the low input impedance of OA1 via SW1 and SW2.

It is known, however, that solid state analog switches, such as the C-MOS type, do present a finite resistance between their respective contacts. This resistance, when this type of switch is utilized in the embodiment of FIG. 1, causes a slight voltage drop to occur between the contacts of SW1 and SW2.

With the switch contacts in the position shown in FIG. 1, the end of R2 at point S2 is normally considered to be at virtually ground potential, however, due to the resistance of contacts C2, A2 of SW2, point S2 is at some finite potential above ground. It has been found that the contact resistance of a typical C-MOS type switch is approximately 10 ohms. Neglecting any currents which flow in the circuit, except that current which flows through contacts A2, C2 of SW2, and assuming $I_2 = 1$ ma and Ron = 10 ohms (Ron is the resistance of contacts C2, A2), then the voltage drop across A2, C2, or the potential of S2 with respect to ground, is 10 millivolts (ie, 1 ma of current is flowing through C2, A2 contacts).

An additional current is caused to flow through C2, A2 contacts by virtue of the presence of R2, which causes an additional voltage drop across those contacts. This additional current flow can be understood by assuming that I₂ at S1 is in a positive half cycle. This causes I₂ to now flow through $R_1$ into OA1 at C as previously described. Also, note that S1 is positive with respect to point C, because of the negative output ($-V_z$) of OA1. It is further significant to note that, even though the resistance of contacts C1, A1 of SW1 is also approximately 10 ohms, that resistance has a negligible affect on the potentials of S1 and S3. This is because virtually no current is flowing into the inverting (−) input of OA1. All of I₂ is being diverted through R1, thus causing S1 to be at virtually zero volt (eg. 0.5 millivolt). Also, in the embodiment of FIG. 1, R1 and R2 are preferably matched resistors of the same value.

With the preceding assumption and understanding, reference is now made to point S2 of FIG. 1. As shown, a second current $I_2'$ is shown flowing from S2 through R2 into point C of OA1. Using the preceding value where $I_2 = 1$ ma, $I_2'$ also equals approximately 1 ma. That is, the current $I_2'$ flowing through R2 is $I_2' \approx V_z/R2 + \text{Ron}$ (where Ron is the C2, A2 contact resistance). This second current ($I_2'$) is due to the contact resistance of SW2, and it is added to I₂, in the following manner. $I_2'$ now flowing into the output of OA1 exits the amplifier through the −V2 terminal with I₂ with a combined current of 2 ma ($I_2 + I_2'$) to the power supply where the added currents return via ground to point M through contacts C2, A2 of SW2. This double current ($I_2 + I_2'$) now presents a voltage drop across C2, A2 or a potential at S2, of 20 millivolts instead of 10 millivolts as previously described.

From the preceding, it can be seen that a very small potential exists between points S1 and S2. Assuming that S1 is at 0.5 millivolts and S2 is at 20 millivolts, the potential across the secondary winding of the CT is only 19.5 millivolts, which is negligible, thus still providing a substantially short circuit operating condition for the transformer.

While the preceding description dealt with the direction of current flow through SW2 when $I_2$ was in a positive half cycle, no further description is believed necessary for how the circuit operates when $I_2$ is in a negative half cycle, for it is believed that those skilled in the art can analyze the circuit operation by the mere reversal of the direction of current flow through the various circuit components as previously described.

Further, it should be recognized that, when contacts C1, B1 of SW1 and C2, B2 of SW1 are closed, contacts C1, B1 of SW1 present the Ron resistance previously described in connection with SW2. The circuit operates in the same manner as previously described except that $I_2$ flows through R2, $I_2'$ flows through R1 and $(I_2+I_2')$ flows through C1, B1 of SW1.

In view of the foregoing, it can now be seen how the invention functions as a virtually powerless current sensing switch controlled inverter circuit.

As previously mentioned, the invention also operates to perform a basic time-division or amplitude-mark-space modulation function. Still referring to FIG. 1, this function is provided when an alternating or pulsating control signal is applied at terminal D of the analog switch (SW1 and SW2). A representative input signal at D may be a pulsating signal such as that provided by a pulse width modulator 22 as disclosed in my aforementioned U.S. Pat. No. 3,955,138. That signal has a duty cycle proportional to sensed voltage, wherein the instantaneous pulse width is proportional to the corresponding instantaneous magnitude of a sensed input voltage variable applied to the pulse-width-modulator. When a signal of this type is applied to terminal D to rapidly switch SW1 and SW2 (eg. at a 10,000 Hz rate, as compared to the 60 Hz line frequency of $I_1$) the output voltage Vz is a pulsating signal which is a product of the current $I_1$ (or $I_2$) and the control signal applied to terminal D, with that product being equal to power (eg. kwhr) consumption.

While the present invention contemplates its application in a watthour meter or the like, it also has application in most any environment where large AC-current has to be sensed or measured accurately without loading the circuit being measured. To that end, when the invention is applied as a switch controlled polarity reversal circuit, the output voltage or signal $V_z$ is proportional to the magnitude of the current $I_1$ (or $I_2$). Also, when the invention is applied as a pulse width modulator, the output voltage $V_z$ is a pulsating signal with an amplitude proportional to $I_1$ (or $I_2$) and a pulse width proportional to the duty cycle of the signal applied to terminal D of the analog switch.

Figure 2:
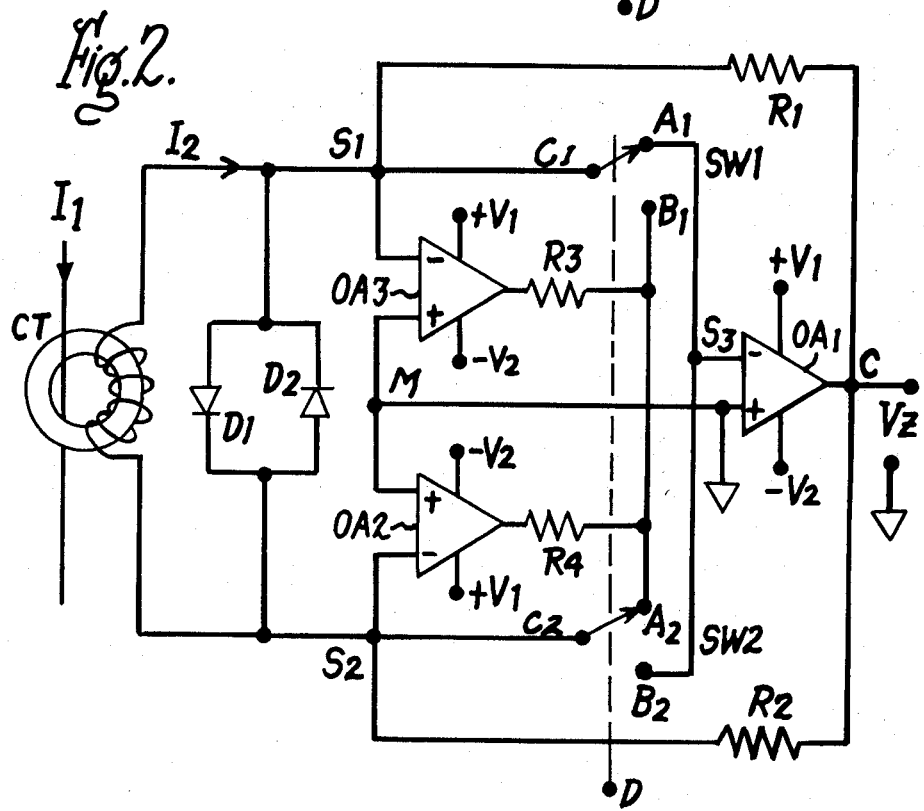
FIG. 2 is an improved embodiment of the invention of FIG. 1, utilizing additional amplifier circuitry for virtually eliminating the need for a low resistance switch in the invention.

Reference is now made to FIG. 2 which illustrates an improved embodiment of the invention. In this embodiment, two operational amplifiers OA2 and OA3, with corresponding feedback resistors R4 and R3, are added to the basic circuit of FIG. 1. Amplifiers OA2 and OA3 may be of the same type as OA1.

As shown in FIG. 2, summing point S1 is connected to the inverting (−) input of OA3, with summing point S2 similarly connected to the inverting (−) input of OA2. Also, the non inverting (+) inputs of OA1, OA2 and OA3 are connected together to a common potential source or ground at point M.

The operation of the embodiment of FIG. 2 is basically the same as that previously described for FIG. 1, except for the inclusion of OA2 and OA3. For that reason, only that portion of the embodiment of FIG. 2 comprising OA2 and OA3 will be described.

The advantage of FIG. 2 is that the use of OA2 and OA3 eliminates the need for low contact resistance analog switches. With the switch contacts C1, A1 of SW1 and C2, A2 of SW2 in the positions shown, the amplifier OA2, in conjunction with its resistor R4, functions as a feedback circuit with the "on" resistance Ron of C2, A2 in a feedback loop to summing point S2 and the − input of OA2.

The input impedance of OA2 is very low, with the impedance between S2 and point M equal to $(R4+Ron)/Ao$, where Ao is the open loop gain of the amplifer OA2. The potential between S2 and M is thus very low. A typical value being much less than one millivolt.

Reference is now made to OA3 and OA1 of FIG. 2. It will be noted that contacts C1, A1 of SW1 are closed to complete the circuit to point S3 to allow OA1 to function as previously described. Also, with the switch contacts as shown, OA3 has no affect on the operation of the circuit. This is because contacts C1, B1 are open, thus removing the amplifier as a feedback circuit via R3 and the "on" resistance of contacts C1, B1 of SW1.

As previously described in connection with FIG. 1, point S1 of that embodiment, and of FIG. 2, is always at substantiately zero volt with respect to point M. As a result, as can be seen in FIG. 2, the potentials of S1 and S2 with respect to point M are both very small, with a typical measurement being less than one millivolt. The secondary of the transformer CT is thus terminated on both ends in an ideal substantially zero impedance. As a result, and in keeping with the teachings of the invention, the embodiment of FIG. 2 provides a virtually non-loading or powerless sensing circuit for monitoring the current $I_1$.

Still referring to FIG. 2, if SW1 and SW2 are switched to close contacts C1, B1 and C2, B2 respectfully, amplifier OA3, in conjunction with R3 and the "on" resistance of contacts C1, B1 provide the feedback closed loop circuit in the manner just described for the amplifier OA2. In this case, OA2 is now isolated from the circuit via contacts C2, A2 as previously described for OA3. Further, it will be noted that contacts C2, B2 are closed to thus reverse the polarity of $V_z$ with respect to $I_2$.

Figure 3:
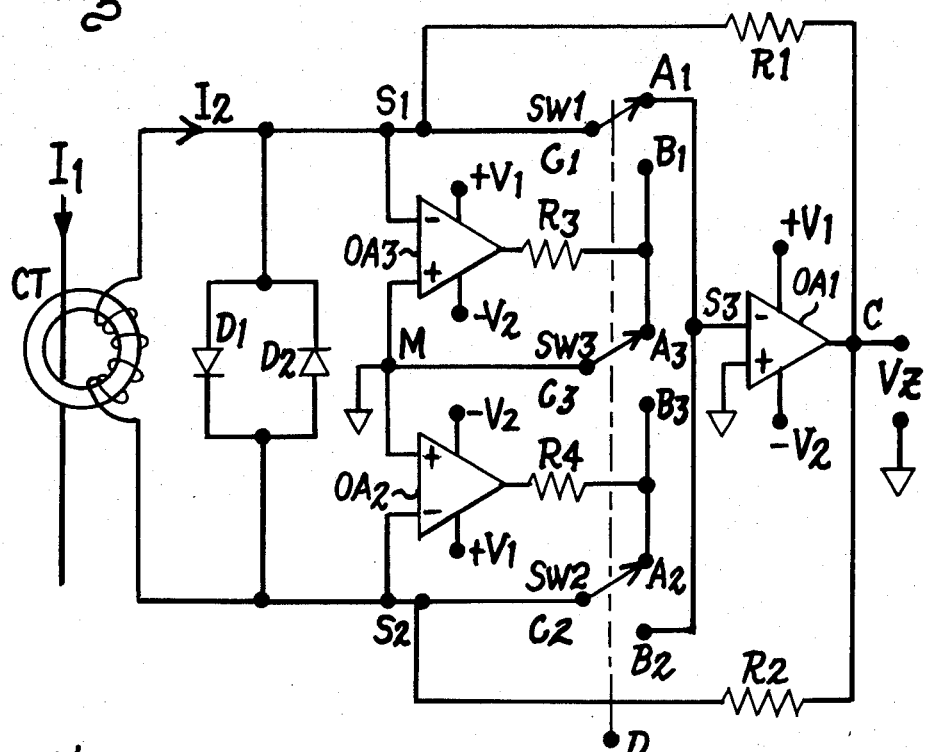
FIG. 3 is still another embodiment of the invention and is an improvement over the embodiment of FIG. 2.

FIG. 3 is similar to the embodiment of FIG. 2, but including an additional set of switch contacts A3, B3 and C3 generally shown as SW3 to form a triple pole double throw switch. This embodiment operates in the same manner as FIG. 2, with the exception that total isolation is provided by the contacts of SW3 at the outputs of amplifiers OA2 and OA3. As shown in FIG. 3, the output of amplifier OA3 is grounded at point M via contacts C3, A3 to isolate OA2 from OA3, while contacts C2, A2 are closed to complete the feedback path around OA2. In a similar fashion, the output of OA2 is grounded at point M and OA3 is isolated from OA2 when contacts C3, B3 are closed along with contacts C1, B1 and C2, B2. In this embodiment, SW3 ensures that any small voltage gradient present at the output of the amplifier (OA2 or OA3) not being used does not affect the potential of the input of the amplifier connected in feedback configuration. This is effected by absolutely grounding the output terminal of the presently unused amplifier while isolating the presently used amplifier from the unused amplifier. Also, in the embodiment of FIG. 3, the − input of OA1 is connected to ground (point M).

In the embodiments of FIGS. 2 and 3, while it is preferable that the resistors R1, R2, R3 and R4 be of the same value, those resistors do not have to be matched as preferred for the FIG. 1 embodiment. This is because of the use of amplifiers OA2 and OA3 which allow the use of non-low contact resistance switches in the aforementioned feedback loops to keep the potentials of S1 and S2 at virtually zero volts.

Figure 4:
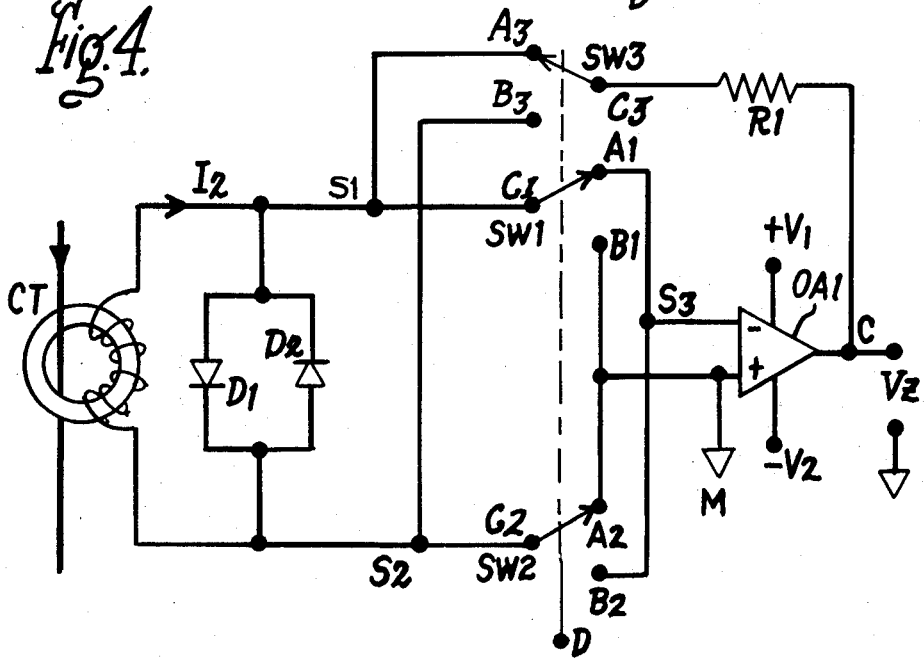
FIG. 4 is similar to FIG. 1, however, utilizing a switched feedback technique which allows the elimination of certain electronic components.

FIG. 4 is a similar embodiment to that of FIG. 1, incorporating SW3 as a switchable feedback element with R1 around OA1, which eliminates R2. This embodiment operates in the same manner as heretofore described for FIG. 1, except for the control of feedback current by SW3. With the switch contacts in the position shown, current $I_2$ is allowed to flow from point S1 through SW3 contacts A3, C3 and R1 into point C and back to S1 as previously described. When the switch (SW1, SW2, SW3) contacts are switched to the bottom positions of FIG. 4, current $I_2$ is then allowed to flow from S2 through R1 via SW3 contacts B3, C3 into OA1 at point C. Current from OA1 is also allowed to flow back to point S2 through this same path with a change in the polarity of $I_1$ or $I_2$ in the same manner that it flows into point S1 from the OA1 output at point C.

In embodiment of FIG. 4, there is some slight "on" resistance Ron across contacts C2, A2 and C1, B1 when they are closed causing a small voltage drop across those respective contacts. $I_2'$ is not present in this embodiment, thus, if $I_2 = 1$ ma and Ron = 10 ohms, then the potential of S1 or S2 is approximately 10 millivolts. This causes a small voltage across the secondary winding of 9.5 millivolts (ie, the potential of S2 − 10 millivolts minus the potential of S1 = 0.5 millivolts equals 9.5 millivolts and visa virsa).

In each of the embodiments of FIGS. 1-4, two reverse parallel connected diodes D1 and D2 are connected across the terminals of the secondary winding of the transformer CT. These diodes serve to provide over voltage or surge current protection for the transformer and the amplifiers connected directly across the secondary winding. Diodes D1 and D2 are normally "off" (non-conducting), as the potential between S1 and S2 and ground is normally low enough to prevent conduction of the diodes. The diodes utilized in the present invention are designed to conduct when a potential of 500 millivolts is applied across the diodes from S1 to S2. When either D1 or D2 conducts (depending on the polarity of $I_2$) the transformer secondary winding and the amplifier inputs are shorted out to thus prevent damage to the circuitry. These diodes also provide protection for the circuitry should some component failure cause the potential of either S1 or S2 to rise above the prescribed diode conduction level.

Although this invention has been described with respect to a few particular exemplary embodiments, those in the art will appreciate that it is possible to modify many features of the exemplary embodiments without departing from the new and improved teachings and features of this invention. Accordingly, all such modifications are intended to be incorporated within the scope of the present invention.

What is claimed is:

1. In combination:
   (a) a low impedance current transformer having primary and secondary windings adapted for conducting primary and secondary currents respectively;
   (b) a very low input impedance operational amplifier having first and second input terminals and an output terminal; and
   (c) a switch, having substantially zero resistance, interconnecting the secondary winding of said current transformer with the first and second input terminals of said operational amplifier for switching the polarity of the secondary current of said current transformer between the first and second input terminals of said operational amplifier while providing a very low impedance connected across the secondary winding, resulting in a negligible potential across the first and second input terminals of said operational amplifier, and providing an output voltage from the output terminal of said operational amplifier having an amplitude proportional to the magnitude of the primary current of said current transformer and having a phase, with respect to the phase of the primary current, determined by the polarity of the current applied to the first and second input terminals of said operational amplifier by said switch.

2. The combination set forth in claim 1 further including a feedback impedance connected between the output terminal of said operational amplifier and said switch for controlling the gain of said operational amplifier as said switch is operated to reverse the polarity of the secondary current applied to the first and second input terminals of said operational amplifier.

3. The combination set forth in claim 1 further including surge current protection means connected across the secondary winding of said current transformer for limiting the magnitude of the current applied to the first and second input terminals of said operational amplifier when the magnitude of the current exceeds a predetermined level.

4. The combination set forth in claim 1 wherein said switch is of the double pole throw type having first and second input terminals connected across the secondary winding of said current transformer and having two pairs of output terminals, each pair associated with a respective one of the input terminals of said switch and being connected to the first and second input terminals of said operational amplifier for switching the polarity of the secondary current to the input terminals of said operational amplifier.

5. The combination set forth in claim 1 wherein said switch includes means for receiving a pulsating signal for operating said switch as a multiplier, whereby the output voltage of said operational amplifier is a pulse train representative of the product of the primary current and the pulsating signal having an amplitude proportional to the magnitude of the primary current and a pulsewidth-spacing proportional to the duty cycle of said pulsating signal.

6. The combination set forth in claim 4 further including first and second feedback resistors, each connected at one end thereof to the output terminal of said operation amplifier and each connected at an opposite end thereof to a corresponding one of the first and second input terminals of said double pole double throw switch.

7. The combination set forth in claim 2 wherein said switch is a triple pole double throw switch having first and second input terminals connected across the secondary winding of said current transformer and a third input terminal for connecting said feedback impedance between the output terminal of said operational amplifier and said switch, said switch further having first, second and third pairs of output terminals associated with said first, second and third input terminals respectively, said first and second pairs being connected to the first and second input terminals of said operational amplifier for switching the polarity of the current applied thereto and said third pair being connected across the secondary winding of said current transformer whereby said feedback impedance is switched to provide a continuous current feedback path for said operational amplifier as said switch is operated to change the polarity of the current applied to the input terminals of said operational amplifier.

8. The combination comprising:
  (a) a current transformer having primary and secondary windings adapted for conducting primary and secondary current respectively;
  (b) first, second and third operational amplifiers, each having first and second input terminals and an output terminal, the first input terminal of said first and second operational amplifiers being connected at opposite ends of the secondary winding of said current transformer with the second input terminal of said first, second and third operational amplifiers being connected in common to a source of potential; and
  (c) a switch connected across the secondary winding of said current transformer and being in communication with the output terminals of said first and second operational amplifiers and the first input terminal of said third operational amplifier for switching the polarity of the current from the secondary winding to the first input terminal of said third operational amplifier while alternately connecting the output terminals of said first and second operational amplifiers in feedback configuration to their respective first input terminals to maintain the potential across the secondary winding at substantially zero volts and thereby create a virtually short circuit operating condition for said current transformer while generating an output voltage at the output terminal of said third operational amplifier proportional in amplitude to the magnitude of the current from said current transformer and which has a phase, with respect to the phase of the transformer current, determined by the polarity of the current applied to the first input terminal of said third operational amplifier from said switch.

9. The combination set forth in claim 8 further including surge protection means connected across the secondary winding of said current transformer for limiting the magnitude of the current applied to the first and second input terminals of said first, second and third operational amplifiers when the magnitude of the current exceeds a predetermined level.

10. The combination set forth in claim 8, wherein said switch is of the double pole double throw type having first and second input terminals connected across the secondary winding of said current transformer and having two pairs of output terminals, each pair associated with a respective one of the input terminals of said switch, one output terminal of each pair being connected together and at the first input terminal of said third operational amplifier, and the other output terminal of each pair being connected together and to the output terminal of each of said first and second operational amplifiers.

11. The combination set forth in claim 8, wherein said switch includes means for receiving a pulsating signal for operating said switch as a multiplier, whereby the output voltage of said third operational amplifier is a pulse train representative of the product of the primary current and the pulsating signal having an amplitude proportional to the magnitude of the primary current and a pulsewidth-spacing proportional to the duty cycle of said pulsating signal.

12. The combination set forth in claim 8 further including first and second feedback resistors associated with said first and second operational amplifiers respectively, each connected at one end thereof to the output terminal of said third operational amplifier and each connected at an opposite end thereof to the first input terminal of their respectively associated operational amplifiers.

13. The combination set forth in claim 12 further including third and fourth feedback resistors, each connected at one end to the output terminal of an associated one of said first and second operational amplifiers and each connected at the other end to said switch whereby said second and third feedback resistors are alternately connected in feedback configuration, via said switch, to the first input terminal of each resistor's respectively associated operational amplifier.

14. The combination set forth in claim 8, wherein said switch is of the triple pole double throw type having first and second input terminals connected across the secondary winding of said current transformer and a third input terminal connected to said source of potential, said switch further including first, second and third pairs of output terminals associated with the first, second and third input terminals respectively of said switch, one output terminal of each of said first and second pairs being connected together and at the first input terminal of said third operational amplifier, the other output terminal of each of said first and second pairs being connected to an output terminal of a corresponding one of said first and second operational amplifiers and the output terminals of said third pair each being connected to a corresponding one of the output terminals of said first and second operational amplifiers.

* * * * *